United States Patent [19]
Baeg et al.

[11] Patent Number: 5,917,832
[45] Date of Patent: Jun. 29, 1999

[54] SELF-TEST CIRCUIT AND METHOD UTILIZING INTERLACED SCANNING FOR TESTING A SEMICONDUCTOR MEMORY DEVICE

[75] Inventors: Sanghyeon Baeg, Suwon; Dongsoon Yi, Incheon-Kwangyeukshi, both of Rep. of Korea

[73] Assignee: Samsung Electronics, Co., Ltd., Suwon, Rep. of Korea

[21] Appl. No.: 08/757,970

[22] Filed: Dec. 5, 1996

[30] Foreign Application Priority Data

Dec. 7, 1995 [KR] Rep. of Korea ...................... 95-47583

[51] Int. Cl.$^6$ ............................ G11C 29/00; G01R 31/28
[52] U.S. Cl. ................... 371/21.1; 371/22.31; 365/201; 365/189.04; 365/189.05; 365/189.12
[58] Field of Search ................................ 371/21.1, 22.31, 371/22.32, 22.36, 22.5, 22.6; 395/183.06, 183.01, 183.03, 183.18, 185.07; 365/201, 189.01, 189.02, 189.03, 189.04, 189.05, 189.08, 189.12; 364/265.3, 944.92

[56] References Cited

U.S. PATENT DOCUMENTS

| | | | |
|---|---|---|---|
| 4,493,077 | 1/1985 | Agrawal et al. | 371/22.36 |
| 4,953,128 | 8/1990 | Kawai et al. | 365/189.12 |
| 5,504,756 | 4/1996 | Kim et al. | 371/22.34 |
| 5,519,714 | 5/1996 | Nakamura et al. | 371/22.31 |
| 5,715,255 | 2/1998 | Whetsel | 395/189.06 |

Primary Examiner—Trinh L. Tu
Attorney, Agent, or Firm—Marger Johnson & McCollom P.C.

[57] ABSTRACT

A self-test circuit and method for efficiently testing a semiconductor memory device are described. A plurality of memory cells is provided with each memory cell comprising a storage location with a data value stored therein. A control circuit is provided for controlling a test of the memory cells. A shift multiplexer is provided for generating a write signal responsive to a shift signal received over a connection to the control circuit. A latch multiplexer is provided for generating a read signal responsive to a latch signal received over a connection to the control circuit. A plurality of output registers are provided with each output register connected to the latch multiplexer and including a connection for reading the data value from the storage location of one of the memory cells responsive to the latch multiplexer and a further connection for generating the data value as an output. A plurality of input registers are provided with each input register connected to the shift multiplexer and including a connection for receiving the data value as an input and a connection for writing the data value into the storage location of one of the memory cells responsive to the shift multiplexer. A plurality of multiplexers are provided with each multiplexer being operatively interconnected between one of the output registers to receive the output data value generated therefrom and one of the input registers to generate the input data value received thereinto. The control circuit is interconnected between a leftmost output register and a rightmost multiplexer to receive the data value generated from the leftmost output register and to generate a test input signal as the input data value into the rightmost multiplexer.

17 Claims, 3 Drawing Sheets

SELF-TEST CIRCUIT AND METHOD UTILIZING INTERLACED SCANNING FOR TESTING A SEMICONDUCTOR MEMORY DEVICE

BACKGROUND OF THE INVENTION

This invention relates generally to a self-test circuit for semiconductor memory devices and more particularly to a self-test circuit and method utilizing interlaced scanning for testing semiconductor memory devices.

Modern integrated circuits generally employ various types of built-in semiconductor memory devices for use in performing data processing. For example, a combination of large-scale and small-scale memory devices are employed in a typical digital signal processing circuit for processing a digital signal.

Moreover, advances in sub-micron processing technology have enabled memory devices to become highly integrated. Unfortunately, the high level of integration also causes the testing of memory devices built into integrated circuits to become difficult and time-consuming. Various kinds of errors can be produced due at least in part to the substantial number of combinations of memory cells possible in each memory device. Accordingly, the demand for a self-test circuit and method for effectively testing built-in memory devices has increased.

A prior art approach to testing built-in memory devices utilizes a built-in self-test (BIST). According to this approach, a self-test circuit for testing the memory device is fabricated onto the integrated circuit and testing of the built-in memory device is performed by the integrated circuit itself. The BIST approach has been widely used for testing built-in memory devices because of its relatively simple construction, as compared to that required for, as an example, self-testing logic blocks. Moreover, from a practical design standpoint, no substantial amount of additional hardware is required.

As further described hereinbelow with reference to FIG. 2 in the Detailed Description, one prior art BIST approach employs a conventional built-in self-test circuit utilizing multiplexers for testing a memory device. There are several drawbacks to this approach. First, the self-test circuit is applicable only to synchronous memory devices. Additional hardware components are required for testing asynchronous memory devices which require the data to be shifted serially. Second, the self-test circuit is limited to testing only the memory cells in the memory device and not logic blocks which are coupled to the memory cells in the memory device. Lastly, one multiplexer is required per bit line of memory.

As further described hereinbelow with reference to FIG. 3 in the Detailed Description, another prior art BIST approach employs a conventional built-in self-test circuit utilizing a scan chain to perform serial memory accesses for testing a memory device. According to this approach, input and output registers are successively coupled to form a scan chain. However, a delay of up to one clock cycle for each bit in a memory word must elapse before data read out from the memory device and stored into the output register is output by the scan chain. Consequently, high speed, asynchronous testing is not possible.

Therefore, there is a need for a self-test circuit and method for efficiently testing both synchronous and asynchronous memory devices without the attendant delay incurred by serially accessing each bit in a memory word.

SUMMARY OF THE INVENTION

It is an object of the present invention to provide a self-test circuit and method for testing semiconductor memory devices which employs a serial interface between an asynchronous memory device and a memory control circuit yet avoids the use of a scan access into the integrated circuit.

An embodiment of the present invention is a self-test circuit for efficiently testing a semiconductor memory device. A plurality of memory cells is provided with each memory cell comprising a storage location with a data value stored therein. A control circuit is provided for controlling a test of the memory cells. A shift multiplexer is provided for generating a write signal responsive to a shift signal received over a connection to the control circuit. A latch multiplexer is provided for generating a read signal responsive to a latch signal received over a connection to the control circuit. A plurality of output registers are provided with each output register connected to the latch multiplexer and including a connection for reading the data value from the storage location of one of the memory cells responsive to the latch multiplexer and a further connection for generating the data value as an output. A plurality of input registers are provided with each input register connected to the shift multiplexer and including a connection for receiving the data value as an input and a connection for writing the data value into the storage location of one of the memory cells responsive to the shift multiplexer. A plurality of multiplexers are provided with each multiplexer being operatively interconnected between one of the output registers to receive the output data value generated therefrom and one of the input registers to generate the input data value received thereinto. The control circuit is interconnected between a leftmost output register and a rightmost multiplexer to receive the data value generated from the leftmost output register and to generate a test input signal as the input data value into the rightmost multiplexer.

A further embodiment of the present invention is a method using a self-test circuit for testing a semiconductor memory device. The memory device comprises a plurality of memory cells with each memory cell being associated with an input register, an output register and a multiplexer interconnected therebetween. A control circuit is interconnected between a leftmost output register and a rightmost multiplexer. A data value is received from the control circuit into the rightmost multiplexer and the data value is generated into the input register interconnected with the rightmost multiplexer. The data value is written from the input register into the associated memory cell responsive to a shift signal. The data value is read from the associated memory cell into the output register to which the memory cell is associated. The data value is latched into the output register responsive to a latch signal and the data value is generated into the multiplexer to which a next memory cell is associated. The steps of writing, reading and latching the data value are repeated until the data value has been read from each of the memory cells.

The foregoing and other objects, features and advantages of the invention will become more readily apparent from the following detailed description of a preferred embodiment of the invention which proceeds with reference to the accompanying drawings.

DETAILED DESCRIPTION

Figure 1:
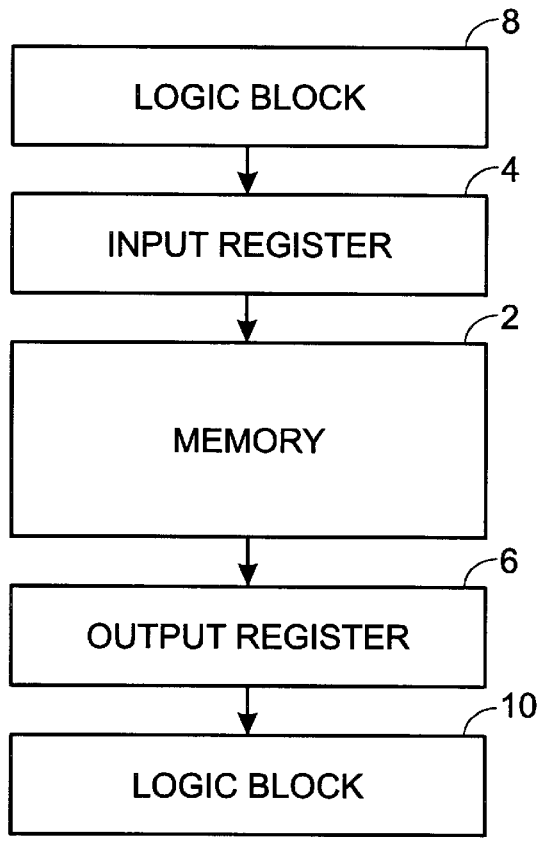
FIG. 1 is a block diagram of a prior art conventional semiconductor memory device.

Referring to FIG. 1, a block diagram of a prior art conventional semiconductor memory device is shown. The memory device comprises a memory 2 in which a plurality of memory cells (not shown) are arranged, an input terminal register 4, an output terminal register 6 and logic blocks 8 and 10. Logic block 8 is interconnected with the inputs of memory 2 through input terminal register 4. Likewise, logic block 10 is interconnected with the outputs of memory 2 through output terminal register 6. During operation of the memory device, the input and output terminal registers 4 and 6 respectively intercept the inputs and outputs of memory 2. Thus, the transmission and receipt of signals between the logic blocks 8 and 10, respectively, and the memory 2 can be stably monitored at high speed. The memory device is tested by writing test bit vectors repeatedly into memory 2 and subsequently reading out the stored test bit vectors from memory 2.

Figure 2:
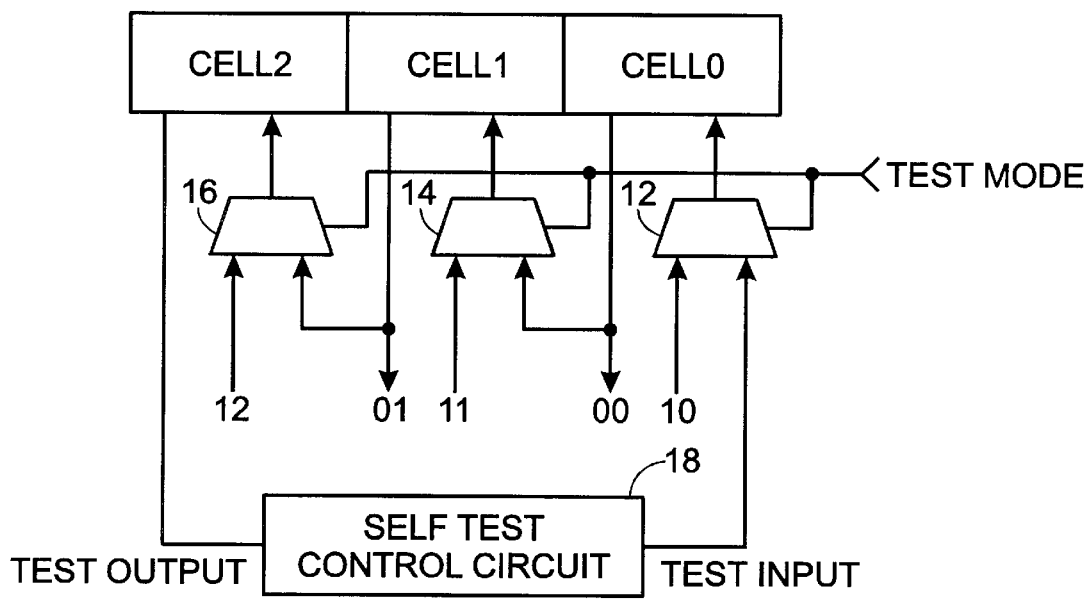
FIG. 2 is a block diagram of a prior art conventional built-in self-test circuit utilizing multiplexers for testing a semiconductor memory device.

Referring to FIG. 2, a block diagram of a prior art conventional built-in self-test circuit utilizing multiplexers for testing a memory device is shown. To facilitate the present discussion, only three memory cells, cell 0, cell 1 and cell 2, from one of the memory lines in the memory device are illustrated, although the actual memory device would comprise a plurality of memory lines with more memory cells per memory line.

Multiplexers 12, 14, 16 are employed in the self-test circuit to effect a serial connection between a self-test control circuit 18 and the memory device. In test mode, a test input signal from the self-test control circuit 18 is received into each of the memory cells in the memory device in sequence. The multiplexers 12, 14, 16 provide external data input signals 10, 11 and 12 to memory cell 0, cell 1 and cell 2, respectively, and enable the data stored in each memory cell to be sequentially read out and written again into the next consecutive memory cell.

Alternatively, the multiplexers 12, 14 and 16 provide the test input signal received from the self-test control circuit 18, signal O0 read out from cell 0 and signal O1 read out from cell 1 to memory cell 0, cell 1 and cell 2, respectively. Specifically, the signal O0 read out from memory cell 0 is coupled to the input of memory cell 1 through multiplexer 14, resulting in an interconnection between memory cell 0 and cell 1 during test mode. Similarly, the signal O1 read out from memory cell 1 is coupled to the input of memory cell 2 through multiplexer 16, resulting in an interconnection between memory cell 1 and memory cell 2 during test mode. Thus, when a test signal is asserted as a logical "1" value, the test input signal from the self-test control circuit 18 is generated to cell 0 through multiplexer 12 and the output read out from memory cell 2 becomes the test output.

This prior art self-test circuit is applicable only to synchronous memory devices. Additional hardware components for serially shifting the data are needed to apply this self-test circuit to asynchronous memory devices. Moreover, while the memory cells in the memory device itself can be tested, logic blocks coupled to the memory cells in the memory device cannot be tested using this device. Moreover, one multiplexer per bit line of memory is required.

Figure 3:
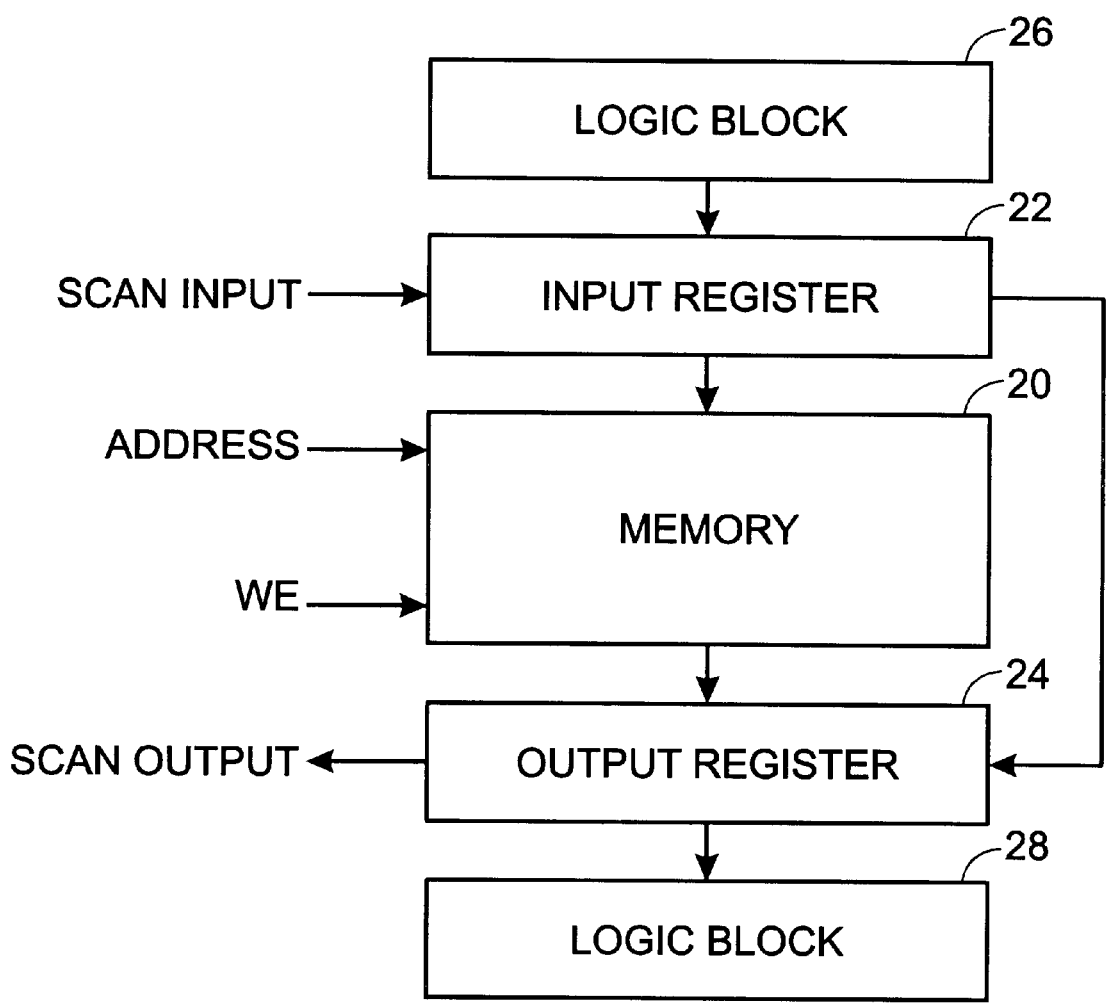
FIG. 3 is a block diagram of a prior art conventional built-in self-test circuit utilizing a scan chain to perform serial memory accesses for testing a semiconductor memory device.

Referring to FIG. 3, a block diagram of a prior art conventional built-in self-test circuit utilizing a scan chain to perform serial memory accesses for testing a memory device is shown. The self-test circuit comprises a memory 20, an input register 22, an output register 24 and logic blocks 26 and 28. Flip-flops form a scan chain around the memory 20 for performing a scan access with input register 22 and output register 24. The memory 20 can also be isolated from logic blocks 26 and 28 for testing purposes, or conversely, logic blocks 26 and 28 can be isolated. However, since input register 22 and output register 24 are successively coupled to form a scan chain, a delay of up to one clock cycle for each bit in a memory word must elapse before data read out from the memory 20 and stored into output register 24 is output by the scan chain as scan output. Consequently, high-speed, asynchronous testing is not possible.

Figure 4:
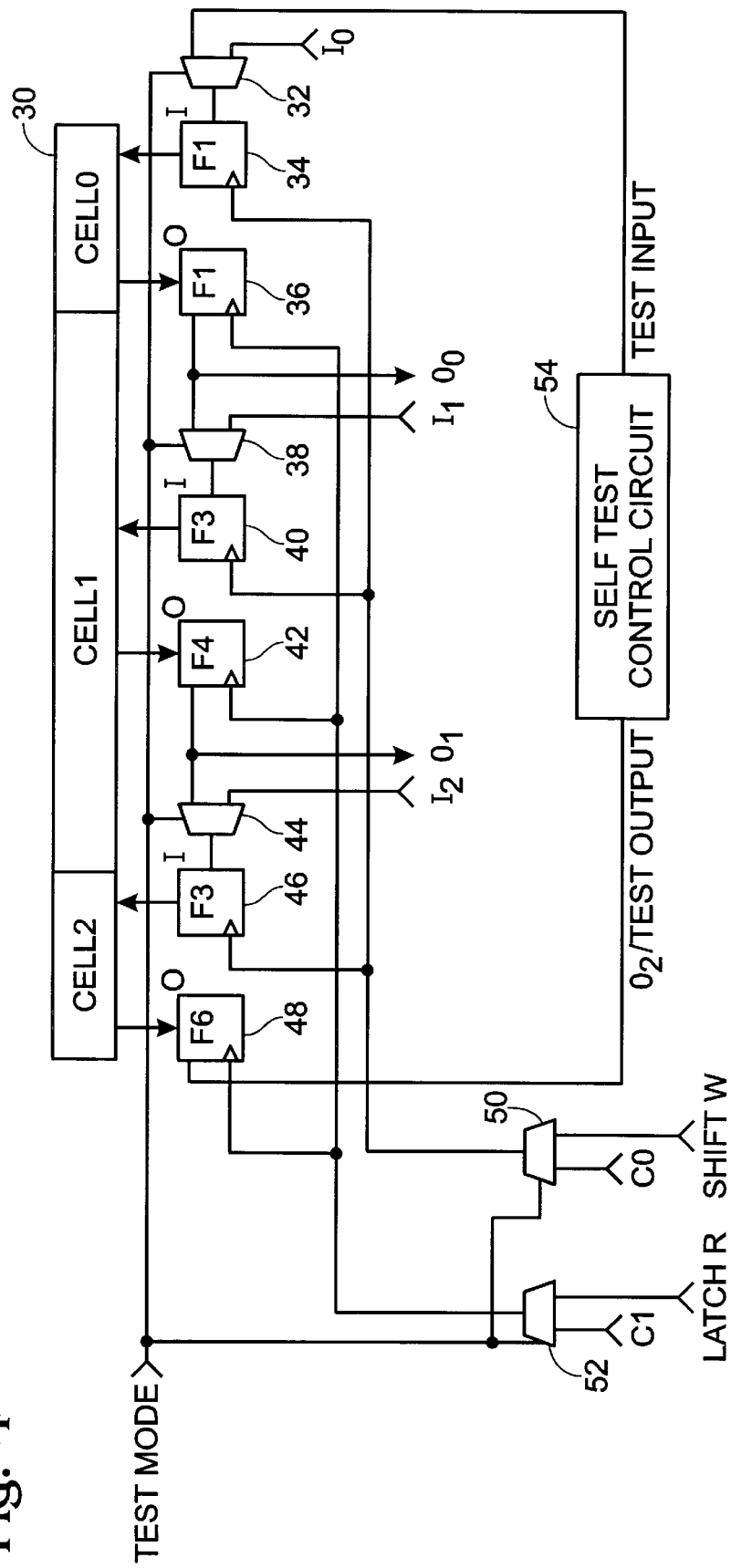
FIG. 4 is a block diagram of a built-in self-test circuit utilizing interlaced scanning for efficiently testing a semiconductor memory device constructed according to the present invention.

Referring to FIG. 4, a block diagram of a built-in self-test circuit utilizing interlaced scanning for efficiently testing a semiconductor memory device constructed according to the present invention is shown. The self-test circuit comprises memory cells, cell 0, cell 1 and cell 2; multiplexers 32, 38, 44, 50 and 52; input registers 34 (F2), 40 (F4) and 46 (F6); output registers 36 (F1), 42 (F3) and 48 (F5) and a self-test control circuit 54. To facilitate the present discussion, only three memory cells, cell 0, cell 1 and cell 2, from one of the memory lines in the memory device are illustrated, although the actual memory device would comprise a plurality of memory lines with more memory cells per memory line.

Latch and shift control signals, respectively received as input signals to multiplexers 52 and 50, are produced by the self-test control circuit 54. The latch signal indicates that output registers 36, 42 and 48 are to read data out from memory cell 0, cell 1 and cell 2, respectively. The shift signal indicates that input registers 34, 40 and 46 are to write data into memory cell 0, cell 1 and cell 2, respectively.

In normal (non-test) mode, multiplexers 32, 38, 44, 50 and 52 select and generate input signals $I_0, I_1, I_2$, C0 and C1, respectively. Input signals $I_0$, $I_1$ and $I_2$ are received from logic blocks (not shown). Input control signals C0 and C1 are also received from the logic blocks. Input registers 34, 40 and 46 latch the signals generated by multiplexers 32, 38 and 44 in response to a control signal generated by multiplexer 50 and, in turn, input registers 34, 40 and 46 provide the latched signals to memory cell 0, cell 1 and cell 2, respectively. Output registers 36, 42 and 48 latch data stored in memory cell 0, cell 1 and cell 2 in response to a control signal generated by multiplexer 52 and, in turn, provide the latched data as output signals $O_0$, $O_1$ and $O_2$, respectively.

In test mode, multiplexers 50 and 52 select and generate shift and latch signals, respectively, as received as inputs. Also, multiplexer 32 selects and generates the test input signal generated by the self-test control circuit 54 and multiplexers 38 and 44 select and generate the signals generated by output registers 36 and 42 in response to the latch signal, respectively. In turn, input registers 34, 40 and 46 latch the output signals generated by multiplexers 32, 38 and 44 in response to the shift signal, and output the latched signals to memory cell 0, cell 1 and cell 2, respectively. Next, output registers 36, 42 and 48 latch data read out from memory cell 0, cell 1 and cell 2, respectively, in response to the latch signal, and output the latched signals. Accordingly, at the following clock cycle, the latched data stored in memory cell 0, cell 1 and cell 2 are received as output signals $O_0$, $O_1$ and $O_2$ into memory cell 1 and cell 2 and the self-test control circuit 54, respectively, with the self-test control circuit 54 generating the test input signal to memory cell 0. The self-test of the memory device is performed by repeating the above-described operation.

To summarize, in test mode, the multiplexers 32, 38 and 44 receive the output values from output registers 36, 42 and 48 and transmit the received values to input registers 34, 40 and 46, while in normal mode, input registers 34, 40 and 46 receive input signals $I_0$, $I_1$ and $I_2$ provided from the logic blocks.

Separate clock signals for input registers 34, 40 and 46 and output registers 36, 42 and 48 for synchronizing their respective operations during normal and test mode operations are not required. Instead, the signals generated by the multiplexers provide the necessary control. In addition, during normal operation, clock signals are provided by a memory control circuit (not shown) which can be timed separately or in synchronicity with the multiplexers.

TABLE 1

| operation | test input | register | memory cells cell 0, cell 1, cell 2 | test output |
|---|---|---|---|---|
| initial state | X | XXXXXX | XXX | X |
| write | 0 | 0XXXXX | 0XX | X |
| read | 0 | 0XXXXX | 0XX | X |
| latch | 0 | 00XXXX | 0XX | X |
| write | 0 | 000XXX | 00X | X |
| read | 0 | 000XXX | 00X | X |
| latch | 0 | 0000XX | 00X | X |
| write | 0 | 00000X | 000 | X |
| read | 0 | 00000X | 000 | X |
| latch | 0 | 000000 | 000 | 0 |

The operation of the self-test circuit will now be described with reference to TABLE 1, shown above. An "X" value denotes a "don't care" condition. In the "operation" column, "write" denotes a write operation to the memory cells, "read" denotes a read operation from the memory cells and "latch" denotes a latch operation in the registers. The "test input" column indicates the value of the test input signal generated by the self-test control circuit 54. The "register" column indicates the values of registers 34, 36, 40, 42, 46 and 48, respectively. The "memory cells" column indicates the values of the data stored in memory cell 0, cell 1 and cell 2, respectively. The "test output" column indicates the value of the test output signal generated by output register 48.

Initially, the test input signal, registers, memory cells and the test output signal are assumed to be in an "X" (don't care) state. When test mode is entered, a write operation is performed in response to a shift signal from multiplexer 50. The test input signal generated as an input value to multiplexer 32 is a logical "0" value. Multiplexer 32 selects and generates the "0" test input signal and register 34 latches the generated "0" signal from multiplexer 32 and writes the latched "0" signal into memory cell 0 in response to a shift signal from multiplexer 50. Accordingly, the state of the registers becomes "0XXXXX," the state of memory cell 0, cell 1, and cell 2 becomes "0XX" and the test output signal becomes "X."

Next, a read operation is performed to output the data stored in memory cell 0, cell 1 and cell 2. Accordingly, the state of memory cell 0, cell 1 and cell 2 becomes "0XX" and the test output signal becomes "X."

Next, a latch operation is performed in response to a latch signal from multiplexer 52. Output registers 36, 42 and 48 latch the data read out from memory cell 0, cell 1 and cell 2 during the read operation. Accordingly, the state of the registers become "00XXXX," the state of memory cell 0, cell 1 and cell 2 becomes "0XX" and the test output signal becomes "X."

Subsequently, the self-test circuit repeatedly performs the write, read and latch operations in sequence. Once the final latch operation (as shown in TABLE 1) is completed, the state of the registers becomes "000000," the state of memory cell 0, cell 1 and cell 2 becomes "000" and the test output signal of the self-test circuit 54 becomes "0." As a result, if the final test output signal is equal to the "0" test input signal of "0," no further memory cells in the memory device remain to be tested. Otherwise, an error condition exists in at least one of the memory cells.

Consequently, the memory device is tested by controlling only the test input signal and by serially writing values in the first through last memory cells. From the foregoing, it will be apparent that the self-test circuit for testing semiconductor memory devices constructed according to the present invention provides the advantages enabling a serial interface between an asynchronous memory device and a memory control circuit without requiring a scan access of the integrated circuit.

Having described and illustrated the principles of the invention in a preferred embodiment thereof, it should be apparent that the invention can be modified in arrangement and detail without departing from such principles. I claim all modifications and variations coming within the spirit and scope of the following claims.

What is being claimed is:

1. A self-test circuit for efficiently testing a semiconductor memory device, comprising:

a plurality of memory cells, each memory cell comprising a storage location with a data value stored therein;

means for controlling a test of the memory cells;

means for generating a write signal responsive to a shift signal received over a connection to the test controlling means;

means for generating a read signal responsive to a latch signal received over a connection to the test controlling means;

a plurality of output storage means, each output storage means connected to the read signal generating means and including means for reading the data value from the storage location of one of the memory cells responsive to the read signal generating means and means for generating the data value as an output;

a plurality of input storage means, each input storage means connected to the write signal generating means and including means for receiving the data value as an input and means for writing the data value into the storage location of one of the memory cells responsive to the write signal generating means; and a plurality of selection means, each selection means being operatively interconnected between one of the output storage means to receive the output data value generated therefrom and one of the input storage means to generate the input data value received thereinto, the test controlling means being interconnected between a leftmost output storage means and a rightmost selection means to receive the data value generated from the leftmost output storage means and to generate a test input signal as the input data value into the rightmost selection means.

2. A self-test circuit according to claim 1, wherein each of the input storage means is an input register.

3. A self-test circuit according to claim 1, wherein each of the output storage means is an output register.

4. A self-test circuit according to claim 1, wherein the write signal generating means further comprises means for selecting an output signal responsive to the shift signal of the test controlling means during a test mode and a control signal received from a logic block during a normal mode.

5. A self-test circuit according to claim 4, wherein the output signal selecting means is a multiplexer.

6. A self-test circuit according to claim 1, wherein the read signal generating means further comprises means for selecting an output signal responsive to the latch signal of the test controlling means during a test mode and a control signal received from a logic block during a normal mode.

7. A self-test circuit according to claim 6, wherein the output signal selecting means is a multiplexer.

8. A self-test circuit according to claim 1, wherein the test controlling means is a self-test control circuit.

9. A self-test circuit according to claim 1, wherein each of the selection means further comprises means for selecting an output signal responsive to the output data value of the output storage means during a test mode and responsive to a signal received from a logic block during a normal mode.

10. A self-test circuit according to claim 9, wherein the output signal selecting means is a multiplexer.

11. A method using a self-test circuit for testing a semiconductor memory device, the memory device comprising a plurality of memory cells, each memory cell being associated with an input register, an output register and a multiplexer interconnected therebetween, a control circuit being interconnected between a leftmost one of said output registers and a rightmost one of said multiplexers, comprising the steps of:

receiving a data value from the control circuit into the rightmost multiplexer and generating the data value into the input register interconnected with the rightmost multiplexer;

writing the data value from the input register into the associated memory cell responsive to a shift signal;

reading the data value from the associated memory cell into the output register to which the memory cell is associated;

latching the data value into the output register responsive to a latch signal and generating the data value into the multiplexer to which a next memory cell is associated;

repeating the steps of writing, reading and latching the data value until the data value has been read from each of the memory cells.

12. A method according to claim 11, wherein each of the multiplexers includes means for receiving an input signal generated by a logic block, further comprising the step of selecting using each multiplexer between the data value generated by the output register during a test mode and the input signal generated by the logic block during a normal mode.

13. A method according to claim 11, wherein an output signal wire connected to a logic block is interposed between the output register for each memory cell and the multiplexer for a next memory cell, further comprising the step of generating the data value over the output signal wire during a normal mode.

14. A method according to claim 11, wherein the memory device further comprises a shift multiplexer, further comprising the step of generating the shift signal using the shift multiplexer responsive to a control signal received from the control circuit.

15. A method according to claim 14, further comprising the step of selecting using the shift multiplexer between the control signal generated by the control circuit during a test mode and a control signal received from a logic block during a normal mode.

16. A method according to claim 11, wherein the memory device further comprises a latch multiplexer, further comprising the step of generating the latch signal using the latch multiplexer responsive to a control signal received from the control circuit.

17. A method according to claim 16, further comprising the step of selecting using the latch multiplexer between the control signal generated by the control circuit during a test mode and a control signal received from a logic block during a normal mode.

* * * * *